(12) United States Patent
Kuo et al.

(10) Patent No.: US 6,664,164 B2
(45) Date of Patent: Dec. 16, 2003

(54) UV-PROGRAMMED P-TYPE MASK ROM AND FABRICATION THEREOF

(75) Inventors: Tung-Cheng Kuo, Yilan Hsien (TW);
Chien-Hung Liu, Taipei (TW);
Shyi-Shuh Pan, Kaohsiung (TW);
Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/125,270

(22) Filed: Apr. 16, 2002

(65) Prior Publication Data

US 2003/0183882 A1 Oct. 2, 2003

(30) Foreign Application Priority Data

Mar. 28, 2002 (TW) ........................................ 91106124 A

(51) Int. Cl.[7] .......................................... H01L 21/8236
(52) U.S. Cl. ........................ 438/275; 438/276; 438/277; 438/278; 257/390; 257/391
(58) Field of Search ............................ 438/128–9, 130, 438/275–8, 257, 290; 257/390, 391

(56) References Cited

U.S. PATENT DOCUMENTS 6,008,522 A * 12/1999 Hong et al. ................. 257/390

* cited by examiner

Primary Examiner—Dung A. Le
(74) Attorney, Agent, or Firm—J.C. Patents

(57) ABSTRACT

A method for fabricating an UV-programmed P-type Mask ROM is described. The threshold voltages of all memory cells are raised at first to make each memory cell be in a first logic state, in which the channel is hard to switch on, in order to prevent a leakage current. After the bit lines and the word lines are formed, the Mask ROM is programmed by irradiating the substrate with UV light to inject electrons into the ONO layer under the openings to make the memory cells under the openings be in a second logic state.

13 Claims, 6 Drawing Sheets

US 6,664,164 B2

UV-PROGRAMMED P-TYPE MASK ROM AND FABRICATION THEREOF

CROSS-REFERENCE TO RELATED APPLICATION

This application claims the priority benefit of Taiwan application serial no. 91106124, filed Mar. 28, 2002.

BACKGROUND OF THE INVENTION

1. Field of Invention

The present invention relates to a read-only memory (ROM) and the fabrication thereof. More particularly, the present invention relates to an UV-programmed P-type mask read-only memory (Mask ROM) and the fabrication thereof.

2. Description of Related Art

In the prior art, a P-type Mask ROM usually comprises a lightly doped N-well in a substrate, a bit line in the N-well, a word line perpendicularly crossing over the bit line, an ONO composite layer between the N-well and the word line, and a silicon oxide layer between the bit line and the word line.

However, since the integration of electronic devices always gets higher and the dimensions of electronic devices become smaller and smaller correspondingly, a leakage current easily occurs between the bit lines during the operation of a P-type Mask ROM because of the small line-pitch. Accordingly, a method for fabricating a P-type Mask ROM is provided in the prior art to solve the leakage problem. The method features with performing a blanket erasing implantation after the bit lines and the word lines are formed, so as to increase the dopant concentration of the lightly doped N-well and thereby improve the leakage problem.

However, some problems are encountered in the modified process described above when the dosage of the blanket erasing implantation is poorly controlled. Specifically, when the dosage of the blanket erasing implantation is insufficient, the leakage problem still remains. When the dosage is too high, however, plenty of dopants will diffuse laterally into the channel to cause the Short Channel Effect (SCE).

SUMMARY OF THE INVENTION

Accordingly, this invention provides an UV-programmed P-type Mask ROM and a method for fabricating the same to prevent a leakage between the bit lines.

This invention provides a method for fabricating an UV-programmed P-type Mask ROM without a blanket erasing implantation. Therefore, the method can prevent the leakage problem or the short channel effect caused by an insufficient dosage or an excess dosage of the blanket erasing implantation in the modified P-type Mask ROM process in the prior art.

The method for fabricating an UV-programmed P-type Mask ROM of this invention is described below. At first, all memory cells are formed having raised threshold voltages to be in a first logic state ("0" or "1"), in which the channel is hard to switch on. This can be done by, for example, forming a heavily doped N-well for the memory cells. A charge trapping layer is formed on the substrate comprising, for example, a silicon oxide/silicon nitride/silicon oxide (ONO) composite layer. Subsequently, a plurality of bit lines are formed in the heavily doped N-well and then an insulating layer, such as a thermal oxide layer, is formed on the bit lines. A conductive layer is formed on the substrate and then patterned into a plurality of word lines, wherein the substrate under a word line and between two bit lines serves as a memory cell. The patterning step is conducted by using the bottom oxide layer of the ONO layer as an etching termination layer, for example. An UV-blocking layer, such as an UV-absorbable layer, is formed over the substrate and then a plurality of openings are formed in the UV-blocking layer to expose selected memory cells that are predetermined to be in a second logic state ("1" or "0"). An UV light is used to irradiate the substrate to inject electrons into the charge trapping layer under the openings to complete the programming process.

The UV-programmed P-type Mask ROM of this invention comprises a heavily doped N-well in a substrate, a plurality of bit lines in the heavily doped N-well, a plurality of word lines crossing over the bit lines, a charge trapping layer between the heavily doped N-well and the word lines, and an UV-blocking layer over the substrate. The UV-blocking layer is, for example, an UV-absorbable layer and has a plurality of openings over selected memory cells therein, and the selected memory cells are written by using UV light. The memory cells covered by the UV-blocking layer are in a first logic state ("0" or "1") and the UV-written memory cells are in a second logic state ("1" or "0").

Since all memory cells are formed on a heavily doped N-well and then programmed by using UV light in this invention, the leakage current between the bit lines can be much reduced.

Moreover, since electrons can be trapped only in the nitride layer and the nitride layer not covered by the word lines is removed, the electrons can be confined in the ONO layer under the word lines not covered by the openings. Therefore, the threshold voltages of the selected memory cells can be lowered specifically and the short channel effect can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A~6A and FIGS. 1B~6B illustrate a process flow of fabricating an UV-programmed P-type Mask ROM according to a preferred embodiment of this invention in a cross-sectional view and in a top view, respectively.

DESCRIPTION OF THE PREFERRED EMBODIMENTS

Refer to FIGS. 1A~6A and FIGS. 1B~6B, which illustrate a process flow of fabricating an UV-programmed P-type Mask ROM according to the preferred embodiment of this invention in a cross-sectional view and in a top view, respectively.

Figure 1B:
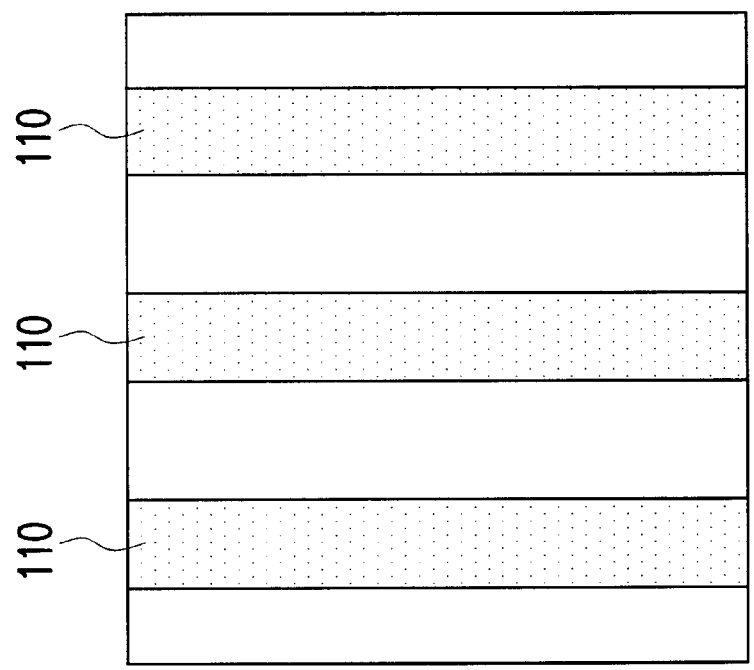
Figure 1A:
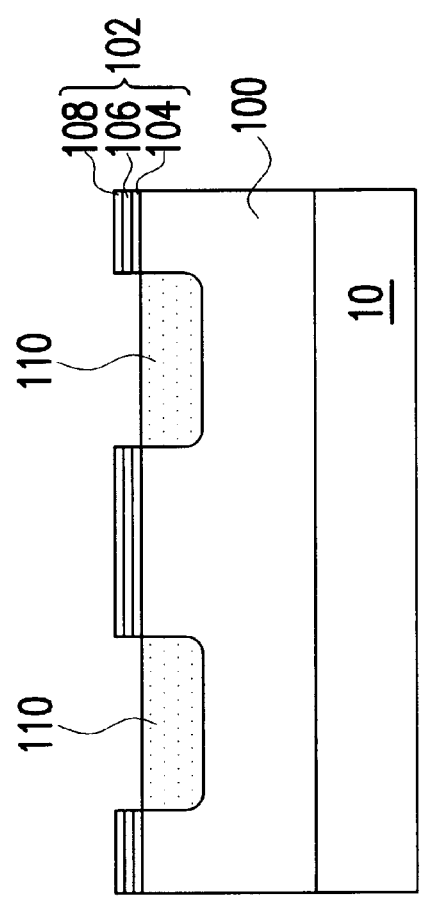

Refer to FIGS. 1A and 1B, a heavily doped N-well 100 is formed in a substrate 10 to raise the threshold voltages of the memory cells that will be formed later, so as to make all of the memory cells be in a state "0" initially. The N-well 100 is formed by, for example, phosphorous ion implantation with an implanting energy of 360 KeV and a dosage of $2.5\times10^{13}/cm^2\sim5\times10^{13}/cm^2$ or with an implanting energy of 60 KeV and a dosage of $5\times10^{12}/cm^2\sim9\times10^{12}/cm^2$. A charge trapping layer 102 is then formed on the substrate 10 comprising a bottom oxide layer 104, a silicon nitride layer 106 and a top oxide layer 108, which together constitute an ONO composite layer. The charge trapping layer 102 is patterned to expose a portion of the substrate 10. An implantation is then performed to form a plurality of bit lines 110 in the N-well 100 by using the patterned charge trapping layer 102 as a mask.

Figure 2B:
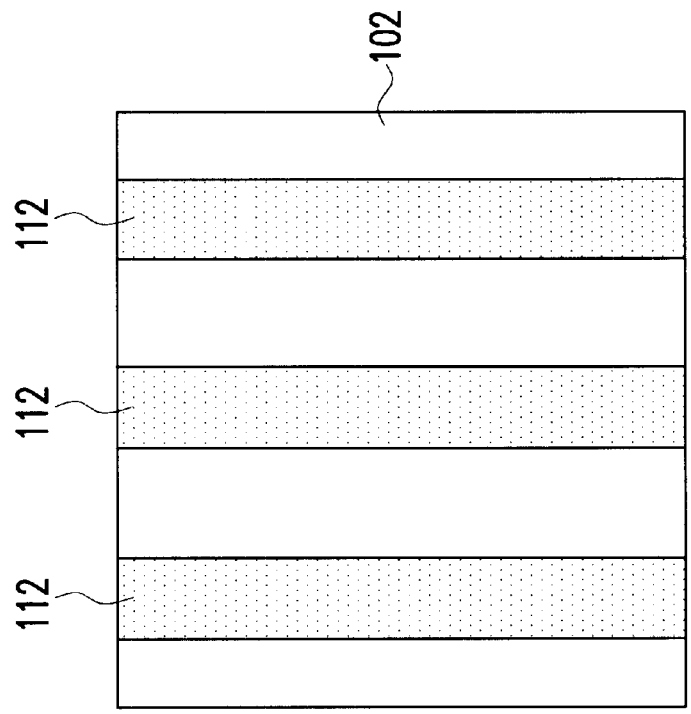
Figure 2A:
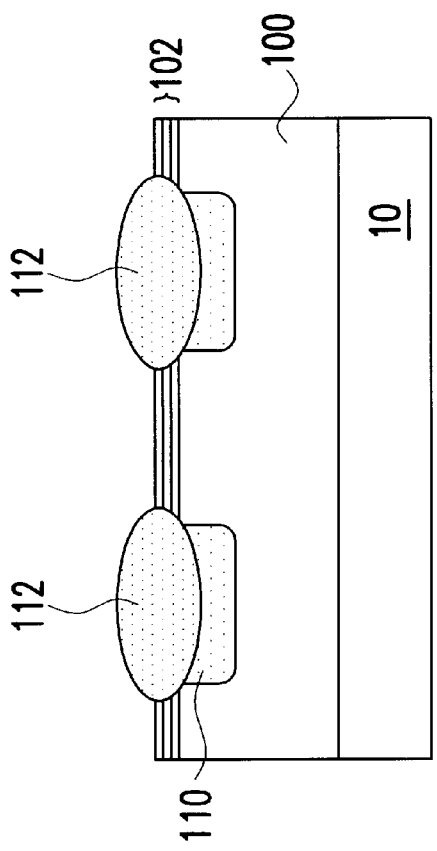

Refer to FIGS. 2A and 2B, a thermal oxide layer 112 is formed on the bit line 110 to isolate the bit line 110 from the word lines that will be formed later.

Figure 3B:
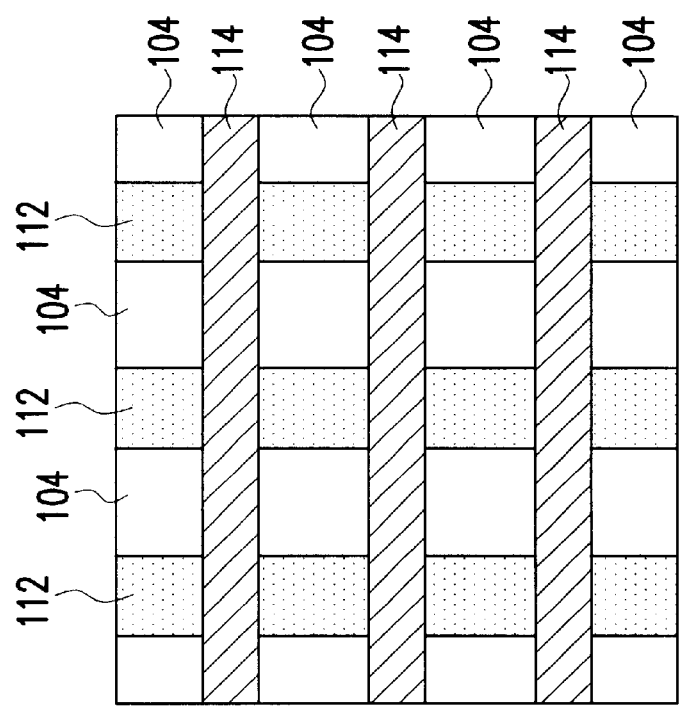
Figure 3A:
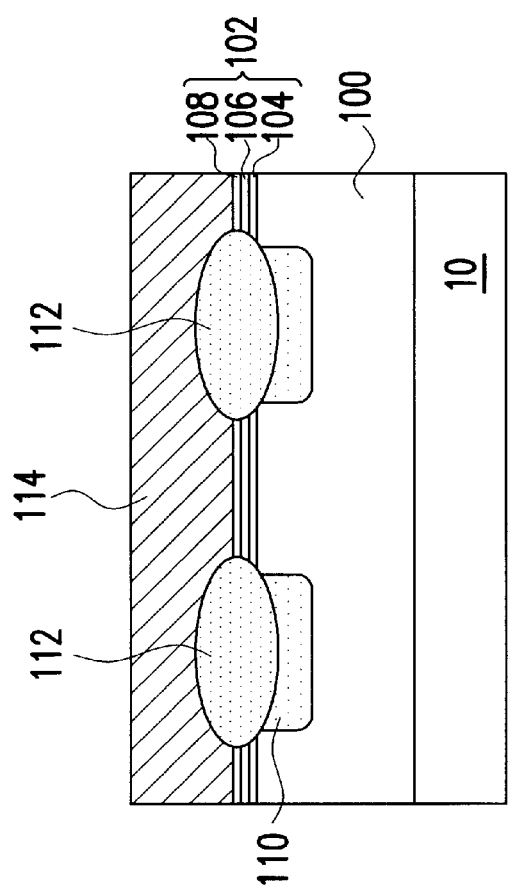

Refer to FIGS. 3A and 3B, a plurality of word lines 114 are formed on the substrate 10 with the following steps, for example. A conductive layer (not shown) like a polysilicon layer is formed on the substrate 10. The conductive layer is then patterned to form the word lines 114 perpendicularly crossing over the bit line 110, wherein the bottom oxide layer 104 of the charge trapping layer 102 serves as an etching termination layer. Thus the nitride layer 106 exists under the word lines 114 only.

Figure 4B:
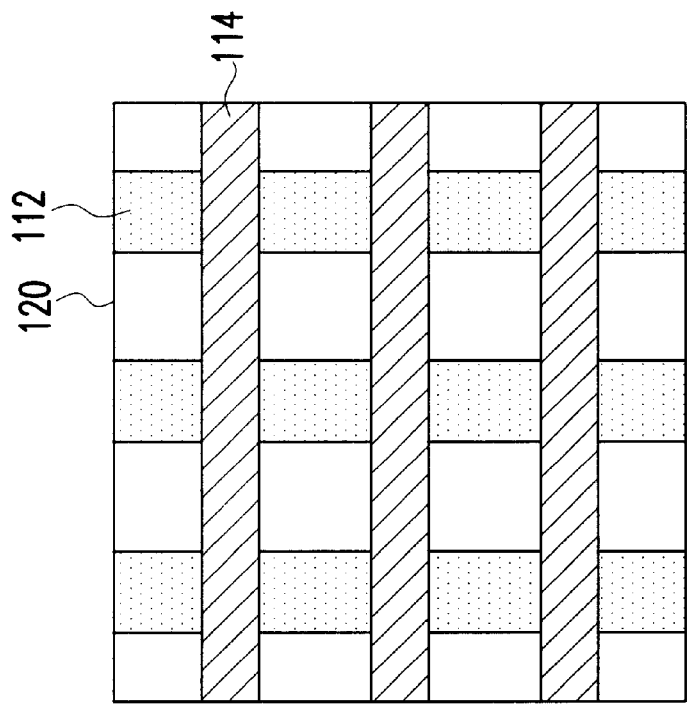
Figure 4A:
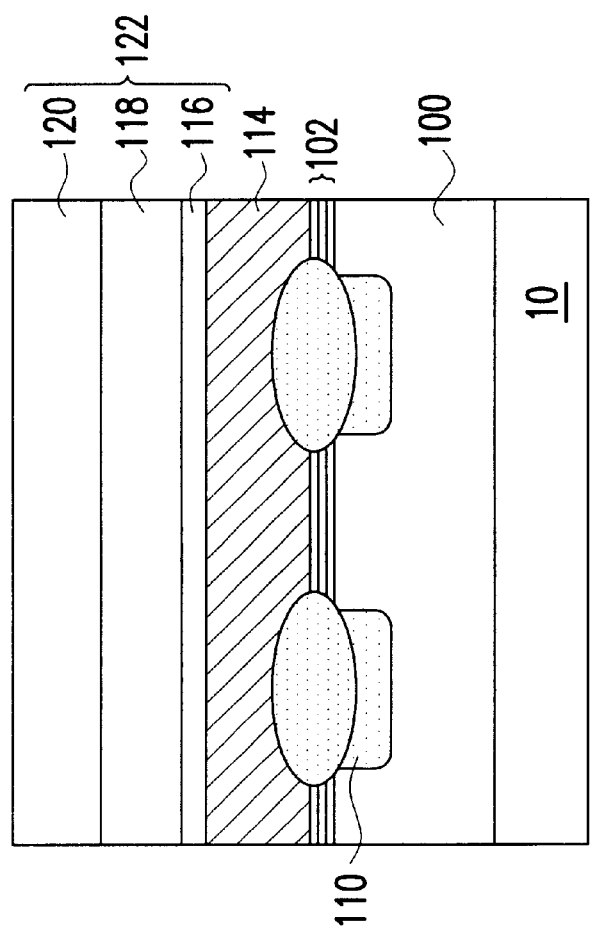

Refer to FIGS. 4A and 4B, an UV-absorbable layer 112 is formed over the substrate 10. The formation of the UV-absorbable layer 112 can be integrated into a contact process of the periphery circuit and therefore comprises a protective layer 116, an anti-reflection coating (ARC) 118 and an inter-layer dielectric layer (ILD) 120. The anti-reflection coating 118 is formed by, for example, chemical vapor deposition (CVD).

Figure 5B:
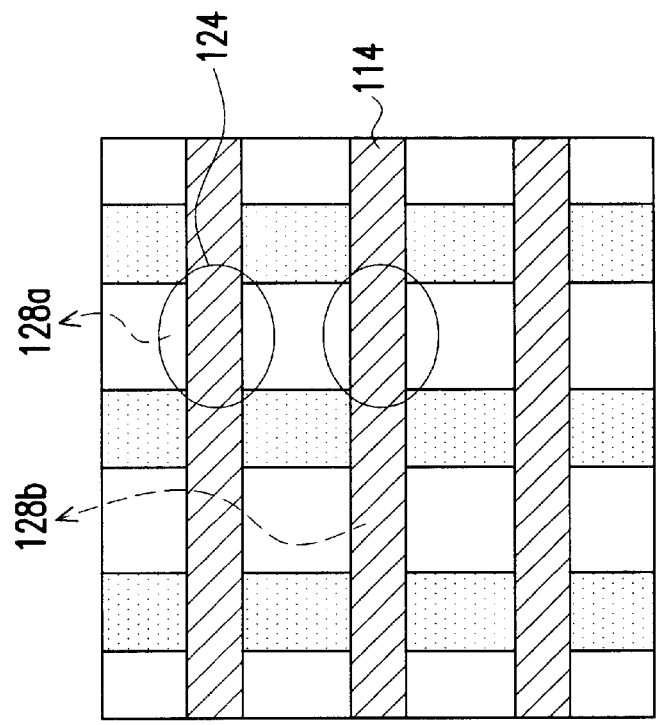
Figure 5A:
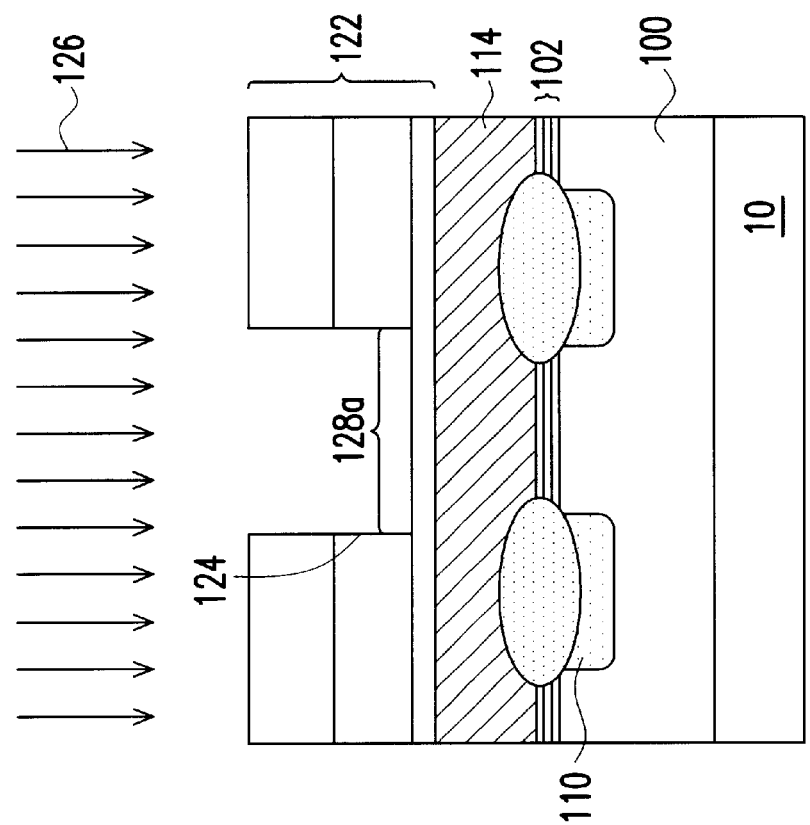

Refer to FIGS. 5A and 5B, a plurality of openings 124 are formed in the UV-absorbable layer 122 over selected memory cells 128a, which are predetermined to store e-bit "1". An UV light 126 is used to irradiate the substrate 10 to inject electrons into the ONO charge trapping layer 102 of the selected memory cells 128a under the openings 124 for programming. The selected memory cells 128a written with UV light are in a state "1", while the other memory cells 128b are still in the state "0". Since electrons can be trapped only in the nitride layer 106 and the nitride layer 106 outside the word line 144 is removed, the electrons can be confined in the charge trapping layer 102 under the word lines 114 not covered by the openings 124. Therefore, the threshold voltages of the written memory cells 128a can be lowered specifically.

Figure 6B:
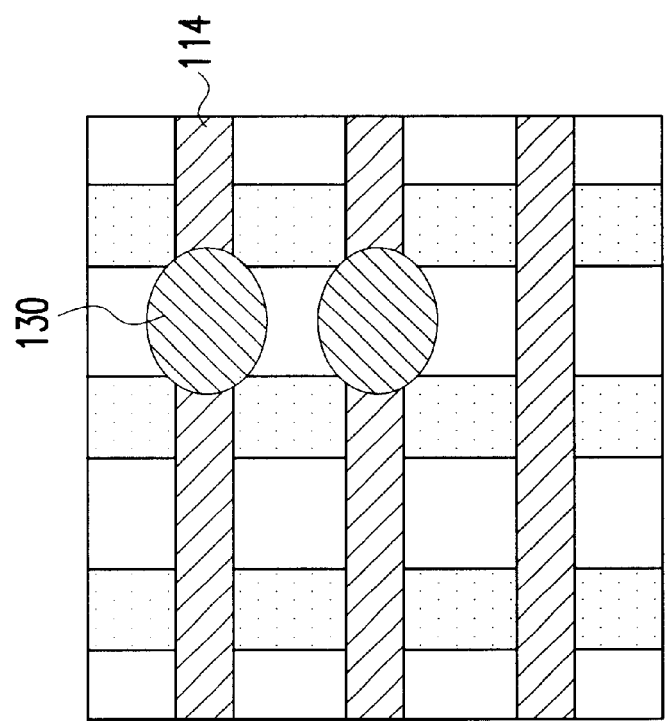
Figure 6A:
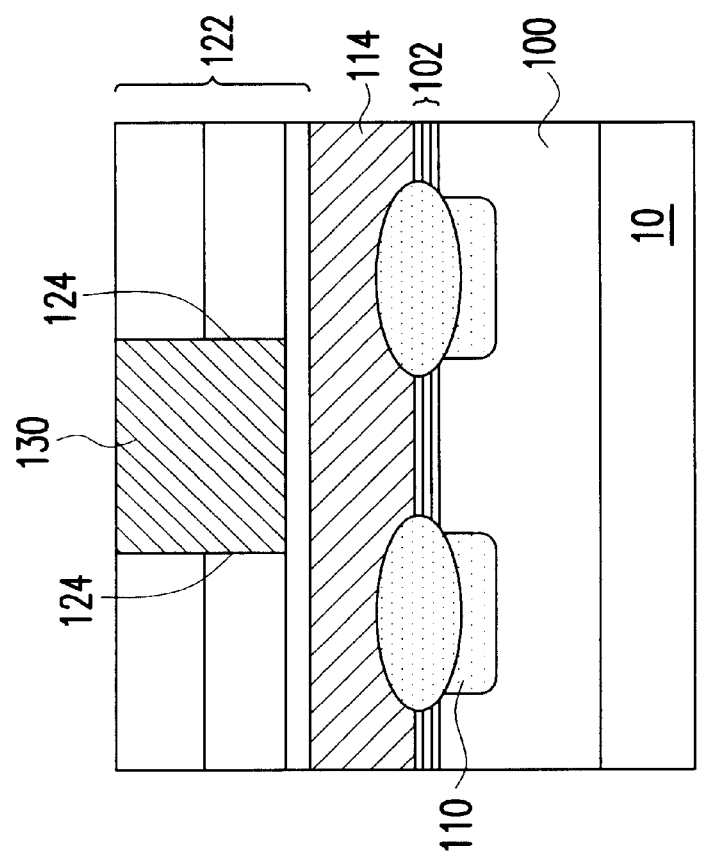

Refer to FIGS. 6A and 6B, when the formation of the UV-absorbable layer 122 is integrated into a contact process of the periphery circuit, a contact plug 130 is further formed in the opening 124. The contact plug 130 is only a dummy pattern and will not affect the operation of the P-type Mask ROM of this invention.

In summary, since all memory cells are formed on a heavily doped N-well and then programmed by using UV light in this invention, the leakage current between the bit lines can be much reduced.

Moreover, since electrons can be trapped only in the nitride layer and the nitride layer outside the word line is removed, the electrons can be confined in the ONO layer under portions of the word line exposed by the openings. Therefore, the threshold voltages of the corresponding memory cells can be lowered specifically and the short channel effect can be prevented.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating an ultraviolet-programmed P-type Mask ROM, comprising the steps of:

forming a heavily doped N-well in a substrate;

forming a charge trapping layer on the substrate;

forming a plurality of bit lines in the heavily doped N-well;

forming an insulating layer on the bit lines;

forming a conductive layer on the substrate;

patterning the conductive layer to form a plurality of word lines crossing over the bit lines, wherein the substrate under a word line and between two bit lines serves as a memory cell;

forming an ultraviolet-blocking layer over the substrate, the ultraviolet-blocking layer having a plurality of openings therein over selected memory cells; and writing the selected memory cells by using ultraviolet light.

2. The method of claim 1, wherein the selected memory cells store e-bit "1".

3. The method of claim 1, wherein a dopant of the heavily doped N-well comprises phosphorous.

4. The method of claim 3, wherein an implanting energy for forming the heavily doped N-well is about 360 KeV.

5. The method of claim 4, wherein an implanting dosage for forming the heavily doped N-well ranges from about $2.5\times10^{13}/cm^2$ to about $5\times10^{13}/cm^2$.

6. The method of claim 3 wherein an implanting energy for forming the heavily doped N-well is about 60 KeV.

7. The method of claim 6, wherein an implanting dosage for forming the heavily doped N-well ranges from about $5\times10^{12}/cm^2$ to about $9\times10^{12}/cm^2$.

8. The method of claim 1, wherein the charge trapping layer comprises a silicon oxide/silicon nitride/silicon oxide (ONO) composite layer.

9. The method of claim 8, wherein a bottom oxide layer of the ONO composite layer serves as an etching termination layer for the step of patterning the conductive layer into the word lines.

10. The method of claim 1, wherein the insulating layer comprises a thermal oxide layer.

11. The method of claim 1, wherein the ultraviolet-blocking layer comprises an ultraviolet absorbable layer.

12. The method of claim 11, wherein the ultraviolet absorbable layer comprises an anti-reflection coating (ARC).

13. The method of claim 12, wherein the anti-reflection coating is formed by a method comprising chemical vapor deposition (CVD).

* * * * *